United States Patent [19]
Beroz et al.

[11] Patent Number: 6,063,648
[45] Date of Patent: May 16, 2000

[54] LEAD FORMATION USINGS GRIDS

[75] Inventors: Masud Beroz, Livermore; Belgacem Haba, Cupertino; Christopher M. Pickett, San Jose, all of Calif.

[73] Assignee: Tessera, Inc., San Jose, Calif.

[21] Appl. No.: 09/181,901

[22] Filed: Oct. 29, 1998

[51] Int. Cl.⁷ .................................................. H01L 21/44
[52] U.S. Cl. .......................... 438/113; 438/123; 361/704
[58] Field of Search ................................... 438/106, 111, 438/123, 110, 117, 113, 128, 129; 361/704

[56] References Cited

U.S. PATENT DOCUMENTS

| | | | |
|---|---|---|---|
| 5,210,939 | 5/1993 | Mallik et al. ............................ | 29/840 |
| 5,420,461 | 5/1995 | Mallik et al. ............................ | 257/734 |
| 5,438,477 | 8/1995 | Pasch ..................................... | 361/689 |
| 5,518,964 | 5/1996 | DiStefano et al. ...................... | 438/113 |
| 5,557,501 | 9/1996 | DiStefano et al. ...................... | 361/704 |
| 5,650,914 | 7/1997 | DiStefano et al. ...................... | 361/704 |
| 5,798,286 | 8/1998 | Faraci et al. ............................ | 438/113 |
| 5,821,608 | 10/1998 | DiStefano et al. ...................... | 257/669 |
| 5,904,498 | 5/1999 | Fjelstad ................................... | 438/106 |
| 5,913,109 | 6/1999 | DiStefano et al. ...................... | 438/117 |
| 5,989,936 | 11/1999 | Smith et al. ............................. | 438/106 |

*Primary Examiner*—John F. Niebling
*Assistant Examiner*—Christopher Lattin
*Attorney, Agent, or Firm*—Lerner, David, Littenberg, Krumholz & Mentlik, LLP

[57] ABSTRACT

A component for making microelectronic units includes a grid of interspersed leads with ends of the various leads being connected to one another by frangible elements. One end of each lead is bonded to a top element and the other end of each lead is bonded to a bottom element. The top and bottom elements are moved away from one another, thereby breaking the frangible elements and deforming the leads towards a vertically extensive disposition. A flowable composition such as dielectric material may be injected around the leads during or after the moving step. The resulting unit may be used to form permanent or temporary connections between microelectronic elements.

14 Claims, 4 Drawing Sheets

LEAD FORMATION USINGS GRIDS

FIELD OF THE INVENTION

The present invention relates to fabrication of microelectronic components including components for connecting microelectronic devices with one another in service and test components used for testing other microelectronic devices.

BACKGROUND OF THE INVENTION

Attempts have been made to make lead grid arrays by forming numerous leads at spaced locations on a metal sheet and bending the leads using a punch and die before attaching them to the components to be connected as shown, for example, in U.S. Pat. Nos. 5,420,461 and 5,210,939.

As disclosed, for example, in certain preferred embodiments of U.S. Pat. Nos. 5,518,964 and 5,798,286, the disclosures of which are hereby incorporated by reference herein and copies of which are annexed hereto, microelectronic components incorporating flexible leads can be made by a process in which the leads are connected between opposing elements and the opposing elements are moved away from one another so as to bend the leads through a controlled displacement. For example, in some embodiments taught by these patents, leads extend along the bottom surface of a dielectric connection component. Each lead has a terminal end connected to a metallic terminal which holds the terminal end of the lead in place. Each lead also has a tip end, remote from the terminal end, which is releasably held on the bottom surface of the dielectric element. The dielectric element is juxtaposed with another element, such as a semiconductor chip, wafer or additional connection component. The tip ends of the leads are bonded to contacts on the opposing element. The elements are then moved away from one another thereby detaching the tip end of each lead from the dielectric element and bending each lead to a vertically extensive disposition. A flowable material such as a curable dielectric liquid may be injected into the space between the leads during or after the movement step and cured to form a compliant dielectric layer surrounding the leads.

Numerous other variations and adaptations of the basic principles taught in these patents are also possible. For example, disclosed in co-pending, commonly assigned U.S. Provisional Patent Application No. 60/077,928, the disclosure of which is hereby incorporated by reference herein, the leads may be connected to one or another of the elements through frangible sections so that after the moving step, the frangible sections break leaving ends of the leads exposed at a surface of the dielectric layer formed from the encapsulant. Such a process can be used, for example, to fabricate test fixtures. As disclosed, for example, in co-pending, commonly assigned U.S. patent application Ser. Nos. 08/366,236, filed Dec. 29, 1994 and 08/989,312, filed Dec. 12, 1997, the disclosures of which are hereby incorporated by reference herein, one or another of the elements may include a metallic plate which is etched after the moving step to form terminals connected to the leads. However despite these and other advances in the art, still further variations would be desirable.

SUMMARY OF THE INVENTION

One aspect of the present invention provides a method of making a microelectronic unit. Methods according to this aspect of the invention desirably include the step of providing a grid formed from a flexible, electrically conductive material such a metal or metals. The grid has a bottom surface and a top surface and includes a plurality of elongated leads. Each lead has first and second ends. The grid further includes frangible elements connecting the first ends of at least some of the leads to the second ends of others of the leads. For example, some or all of the leads may arranged in an interspersed arrangement such that the first end of each such interspersed lead is disposed between the second ends of others of the interspersed leads, whereas the second end of each interspersed lead is disposed between the first ends of others of the interspersed leads.

The grid is placed between a top element and a bottom element so that the top surface of the grid faces toward the top element and the bottom surface of the grid faces toward the bottom element. The first ends of the leads are bonded to the top element but not the bottom element whereas the second ends of the leads are bonded to the bottom element but not to the top element. After bonding the leads to the top and bottom elements, the top and bottom elements are moved with a vertical component of motion away from one another so that the first ends of the leads move upwardly with respect to the second of the leads. During the moving step, the frangible elements connecting the first and second ends of the leads are broken and the leads end deformed to a vertically-extensive disposition. The element including the dielectric layer and the vertically extensive leads can be used, for example, as a connector which can be engaged between microelectronic elements to make temporary contacts during testing or to make permanent connections.

The grid may be provided with a bonding material on the top surface but not on the bottom surface at the first ends of the leads and with a bonding material on the bottom surface but not on the top surface at the second ends of the leads. The step of bonding the leads to the top and bottom element may include the step of activating these bonding materials. The top and bottom elements may include simple metallic plates, in which case the method desirably further includes the step of at least partially removing the metallic plates. Desirably, a flowable composition is injected around the leads as, for example, between the top and bottom elements during or after the step of moving the top and bottom elements away from one another and the flowable composition is cured to form a dielectric layers, such as a compliant gel or elastomer surrounding the leads.

During the moving step, portions of the frangible elements which remain attached to the first ends of the leads may be deformed downwardly relative to the first ends of the leads. These downwardly deformed portions of the frangible elements become embedded in the dielectric layer formed from the flowable composition and aid in anchoring the first ends of the leads to the dielectric layer. Similarly, portions of the frangible elements attached to the second ends of the leads project upwardly into the dielectric layer and also aid in anchoring the leads to the dielectric layer.

In further embodiments of the invention, one or both of the top and bottom elements may include preformed microelectronic elements having contacts thereon as, for example, a semiconductor chip or a dielectric layer with metallic contacts thereon. The bonding step is performed so as to align ends of leads with the contacts of the preformed elements and so as to connect the ends of the leads to such contacts.

In a further variant, the grid may include first conductors connected to the first ends of at least one of the leads. After the moving step, the first conductors extend at the level of the lead first ends. The first conductors may interconnect several lead first ends with one another so that when the component is engaged with a microelectronic element and the leads first ends are connected to contacts on the microelectronic element, the conductors interconnect the various contacts of the microelectronic element. Similarly, the grid may include one or more second conductors connected to the second ends of one or more of the leads, the second conductors remaining attached to the second ends of the leads after the moving step.

A further aspect of the invention provides a component for making a microelectronic assemblies. A component in accordance with this aspect of the invention includes a grid formed from a flexible electrically conductive material, the grid including plural leads each having a first end and a second end. Desirably, at least some of the leads are interspersed with one another so that the first end of each interspersed lead is disposed between the second ends of others of the interspersed leads and so that the second end of each interspersed leads is disposed between the first ends of other interspersed leads. The grid further includes frangible elements interconnecting the first and second ends of different leads to one another. The grid desirably includes bonding material as aforesaid on the top surface but not on the bottom surface of the grid at the first ends of the leads and on the bottom surface but not on the top surface at the second ends of the leads. Preferably, each of the leads is less than about 5 mm long and less than 100 mm wide. The leads may be considerably smaller than these dimensions components in accordance with these aspects of the invention can be utilized in processes as discussed above. The component may include first conductors connected to one or more of the first ends of the leads, second conductors connected to one another of the second ends of the leads, or both.

DETAILED DESCRIPTION OF THE PREFERRED EMBODIMENTS

Figure 1:
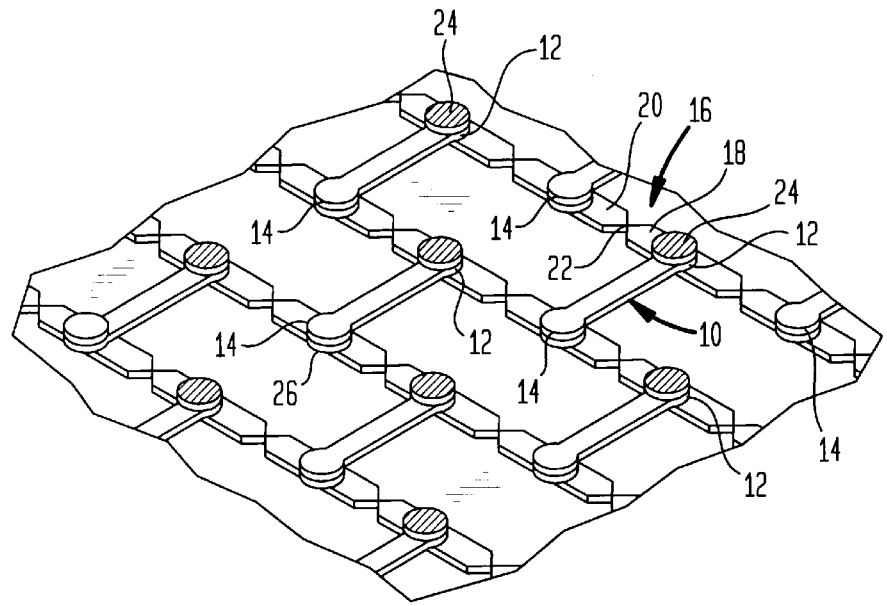
FIG. 1 is a fragmentary, diagrammatic perspective view depicting an element in accordance with one embodiment of the invention.
Figure 2:
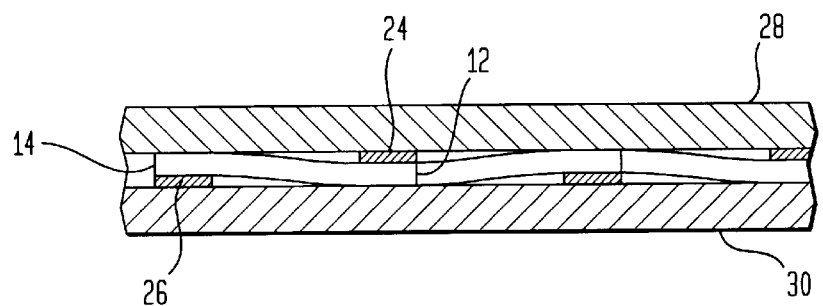
FIG. 2 is a fragmentary, diagrammatic sectional view depicting one stage in a process utilizing the element of FIG. 1 in conjunction with other elements.

A small portion of a component in accordance with one embodiment of the invention is depicted in FIG. 1. The component includes a grid incorporating a large number of leads 10. Each lead has a first end 12 and a second end 14. The leads are arranged in an interspersed array so that the first end 12 of each lead is disposed between the second ends 14 of other leads, whereas the second end 14 of each lead is disposed between the first ends 12 of other leads. The mutually adjacent first and second ends of the various leads are connected to one another by frangible interconnecting elements 16. Each such frangible element 16 includes a first portion 18 connected to the first end of the lead and a second portion 20 connected to the second end of another lead, with a weak point 22 between these portions. The leads are shown as many times their actual size in FIG. 1. Typically, each lead is about 5 mm. long or less, and most typically about 1 mm. long or less, and each lead is about 100 microns wide or less and about 100 microns thick or less, most commonly less than about 50 microns thick and typically about 25 microns thick or less.

The grid is generally in the form of a flat sheet. For example, the leads and frangible elements may be of a uniform thickness, and may be formed, for example, by subtractive etching from a sheet of metal. The grid as a whole defines top and bottom surfaces facing in opposite directions; the top surface is facing up as seen in FIG. 1.

The first end 12 of each lead has an electrically conductive bonding material 24 on the top surface, but not on the bottom surface. Conversely, the second end 14 of each lead bears an electrically conductive bonding material 26 on the bottom surface, but not on the top surface. The bonding material may include essentially any bonding material suitable for use with the other components to be employed in use of the grid. For example, the bonding material may include solder; electric bonding alloys or electrically conductive polymer compositions. Typically, the bonding material is provided only at the ends of the leads, and is not provided on other portions of the grid.

Figure 3:
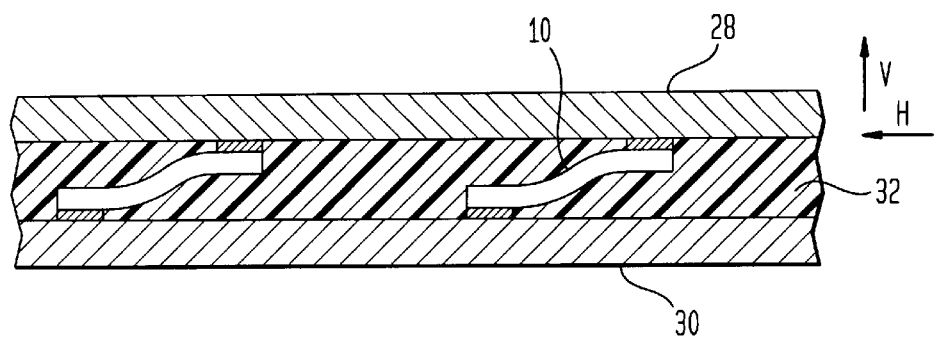
FIG. 3 is a view similar to the FIG. 2 but depicting a later stage in the process.

In a process according to one embodiment of the invention, a grid as seen in FIG. 1 is disposed between a top element 28 and a bottom element 30. In the embodiment illustrated, the top and bottom elements are metal plates such as copper plates. The top and bottom elements are pressed towards one another and into engagement with the top and bottom surfaces, respectively of the grid. Typically, heat is applied at this stage to activate the bonding material. Thus, the bonding material 24 at the first ends 12 of the leads bonds the first ends of the leads to top element 28. In the next stage of the process, the top and bottom elements are moved with a component of motion V in the vertical direction such that these elements move vertically away from one another. This vertical motion bends the leads 10 to a vertically extensive configuration as shown in FIG. 3. The elements may also be moved with a horizontal component of motion H such that the first and second ends of each lead move in the horizontal direction towards one another. A curable liquid material or other flowable material is injected between the top and bottom elements 28 and 30 during or after the moving step and are cured to form a dielectric layer 32 surrounding leads 10.

Figure 4:
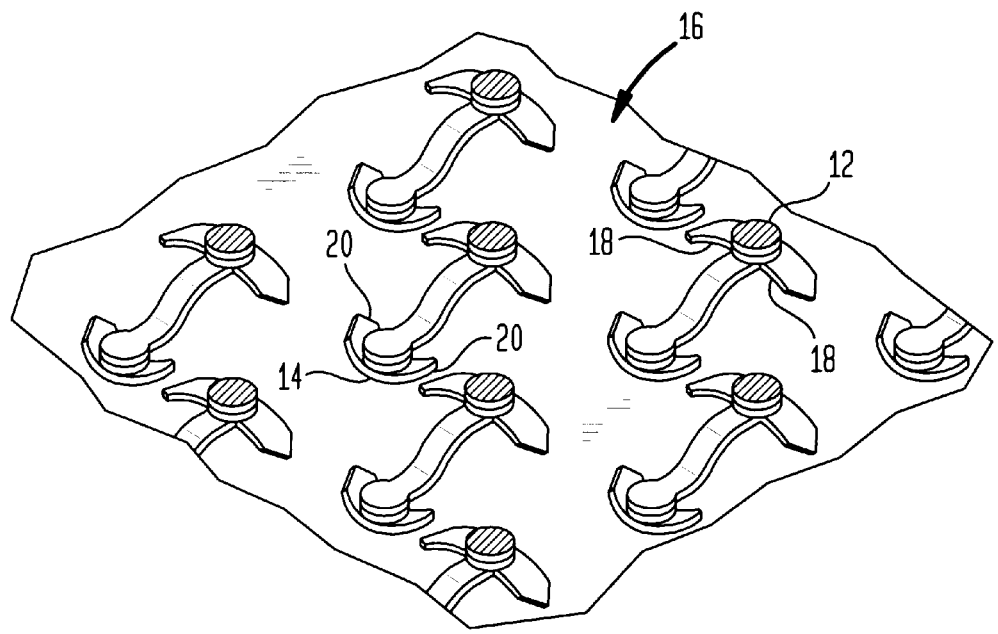
FIG. 4 is a fragmentary, diagrammatic sectional view depicting the elements shown in FIG. 1 after the process step depicted in FIG. 3.

As best appreciated with reference to FIG. 4, the frangible elements 16 are broken by the relative motion of the first and second ends of the leads. Thus, each frangible element 16 breaks at its weak point, leaving first portions 18 connected to a first end 12 of the lead, these first portions 18 being deformed downwardly relative to the first end 12. Conversely, the second portions 20 of the frangible elements remain connected to the second ends 14 of the leads but are bent upwardly. The downwardly-depending frangible element portions 18 associated with the first end of each lead project into the dielectric layer 32 and help to anchor each such first end in the dielectric layer. The second portions 20 of the frangible elements associated with the second ends of the leads project upwardly into the dielectric layer and help to anchor the second ends in the dielectric layer.

Figure 5:
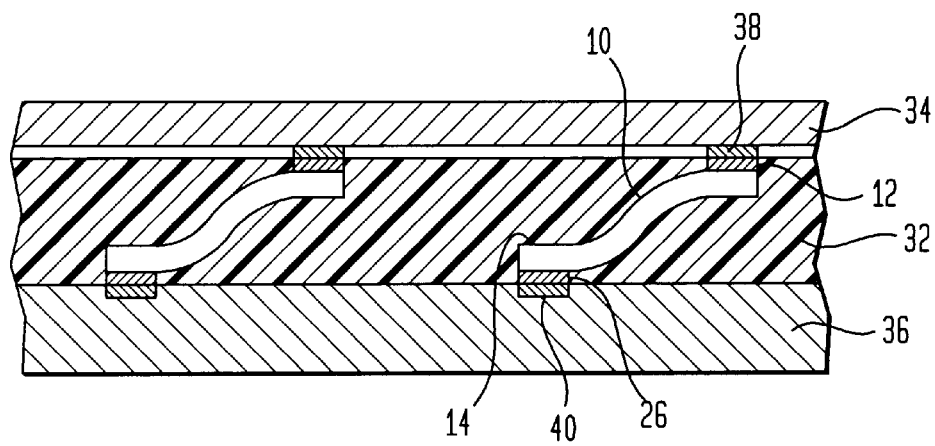
FIG. 5 is a fragmentary, diagrammatic view depicting a structure resulting from the process of FIGS. 1–4 in conjunction with additional elements.

After these steps, the top and bottom elements can be removed as, for example, by etching. Where the bonding material forms a heat-degradable bond such as a solder joint, the top and bottom elements may be entirely removed by heating the assembly to a temperature sufficient to loosen the solder joints and then mechanically removing these elements. The resulting structure can be used to interconnect microelectronic components with one another. For example, as seen in FIG. 5 the structure resulting from removal of the complete top and bottom elements 28 and 30 can be used to interconnect a semiconductor chip 34 with a circuit panel 36. The interconnection may be temporary for testing the chip, or may be permanent. For a permanent interconnection the first ends 12 of each lead are bonded to contact 38 on the semiconductor chip, whereas the second ends 14 of the leads are bonded to contact pads 40 on the circuit panel. The vertically extensive leads provide flexible interconnections which accommodate relative movement of the chip and panel such as movement due to thermal cycling. For a temporary interconnection, these connections are made by pressing the elements together, without bonding the chip contacts.

In an alternate arrangement, elements having predefined contacts or terminals, such as a semiconductor chip, a circuit panel or a flexible dielectric element having terminals thereon can be used as one or both of the top and bottom elements in the process as discussed above. For example, a semiconductor chip 34 may serve as the top element whereas panel 36 may serve as the bottom element in a lead forming process as discussed above with reference to FIGS. 1–4. The contacts 38 and contact pads 40 are bonded to the ends of the leads and the chip and the panel are moved away from one another in the same manner as discussed above with reference to the metallic plates 28 and 30. One or both of the elements may include a plurality of semiconductor chips. For example, an entire wafer can be processed in this manner and then subdivided to form a plurality of packaged chips.

In a further variant, the metallic top and bottom plates is in the process of FIGS. 1–4 are not entirely removed. Instead, after the plates have been moved away from one another and after the flowable composition has been cured to form a dielectric layer 32 surrounding the leads, the top and bottom elements or plates are etched selectively so as to form conductive terminals 28' and 30' connected to the first and second ends 12' and 14' respectively of the leads. Processes for selective etching of metallic layers are disclosed in greater detail in the aforementioned U.S. patent application Ser. Nos. 08/366,230 and 08/989,312. As described in further detail in those applications, spots of an etch-resistant material, desirably a hard, etch-resistant metal such as osimium or rhodium, are deposited on the exposed surfaces of the metallic plates and the metallic plates are exposed to an etchant. The regions aligned with the etch-resistant spots are protected from etching and form the projecting terminals. These methods can be used on only the first ends or on only second ends of the leads. The opposite ends of the leads may be connected to other microelectronic elements in other ways as discussed above.

Figure 7:
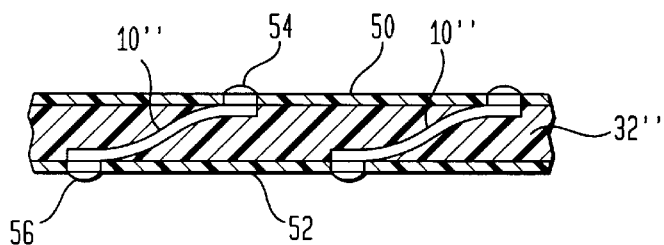
FIG. 7 is a view similar to FIG. 6 but depicting an assembly in accordance with yet another embodiment of the invention.

In the embodiments discussed above, the grid is provided by itself, without any other supporting structure. However, supporting structures such as sheetlike dielectric layers 50 and 52 (FIG. 7) may overlie the top surface of the grid, the bottom surface of the grid, or both. The supporting structures reinforce the grid to prevent accidental deformation of the grid prior to use. The supporting structures may be provided with openings or "vias" 54 and 56 which expose the ends of the leads for connection to the top and bottom elements in the process as discussed above. Alternatively, the supporting structures themselves may act as the top and bottom elements. Such supporting structures can be used, for example, where the leads and frangible elements are so thin or so small that the grid will not support itself and will deform under its own weight. The leads will pull away from the supporting structures during the moving step. For example, the components depicted in FIG. 7 are initially supplied as a flat assembly, with leads 10" releasably connected to the surfaces of dielectric layers 50 and 52. During manufacture of the assembly, the first end of each lead is bonded to a contact within via 54, whereas the second end of each lead is bonded to a contact in a via 56 in the opposite dielectric sheet 54. The dielectric layers are moved away from one another as, for example, by forcible injection of the flowable composition to form a further dielectric layer 32" between these elements. During this movement, the leads are peeled away from the dielectric layers 50 and 52 and the frangible elements of the grid (not shown) are broken in the same way as discussed above with reference to the FIGS. 1–4. The releasable connection between the leads and the supporting structure or dielectric sheets 50 and 52 may be a peelable connection between the metal lead and the polymeric dielectric material. A peelable connection between a metal lead and a polymeric supporting layer can be made by etching the polymer away beneath the leads so as to leave a small strip of polymer connecting the underside of the lead to the polymeric layer, as taught, for example, in copending, commonly assigned U.S. patent application Ser. No. 09/020, 750, filed Feb. 9, 1998, the disclosure of which is hereby incorporated by reference herein. Other types of releasable connections may be employed. In further embodiments (not shown), only one supporting structure, such one dielectric layer 50 or 52 overlies one surface of the grid.

Desirably, the grid is formed from a metal such as copper with or without other metals such as gold. Where the bonding material is a solder or other material having a tendency to wet the metal of the grid, it may be desirable to treat the leads to prevent the bonding material from spreading onto areas where solder is not desired. For example, the first end of each lead may have its bottom surface coated with a material that is resistant to wetting by solder and the top surface may be similarly coated at the second end of each lead. The regions of the lead between the ends, and the frangible elements of the grid, may also be coated with such a material. For example, the areas to be resistant to solder wetting may be nickel-plated or coated with a polymer such as an electrophoretically deposited polymer or oxidized selectively so as to provide a non-wettable oxide coating.

Figure 6:
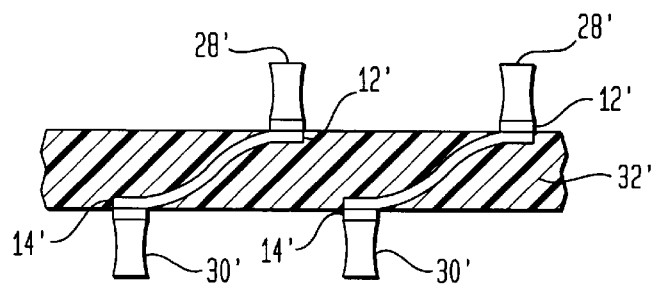
FIG. 6 is a fragmentary, diagrammatic sectional view depicting a portion of an assembly in accordance with a further embodiment of the invention.

The particular lead configuration depicted in the drawings is merely illustrative. For example, the individual leads 110 may be arcuate or otherwise curved in the grid as originally provided, before the bonding and moving steps, as depicted in FIG. 6. As described, for example, in the '964 Patent and in U.S. patent application Ser. No. 08/927,601, the disclosure of which is hereby incorporated by reference herein, such curved leads facilitate performing the vertical bending step without horizontal movement and can provide enhanced electrical properties. Also, the leads may be disposed at any angle with respect to the grid, as for example, at an oblique angle to rows of first and second ends. The grid may also include some restraining straps which are shorter and, typically, more robust than the other leads. These straps act to constrain the movement of the elements relative to one another. The use of such straps is described in co-pending, commonly assigned U.S. patent application Ser. No. 08/989, 582, filed Dec. 12, 1997, the disclosure of which is hereby incorporated by reference herein. In the grid according to this embodiment, the straps may have first and second ends with bonding materials placed in the same way as the leads. The grid need not extend over the entire area of the components to be connected. For example, where a semiconductor chip has contacts only in a small region, the grid may have leads only in such small region.

Figure 8:
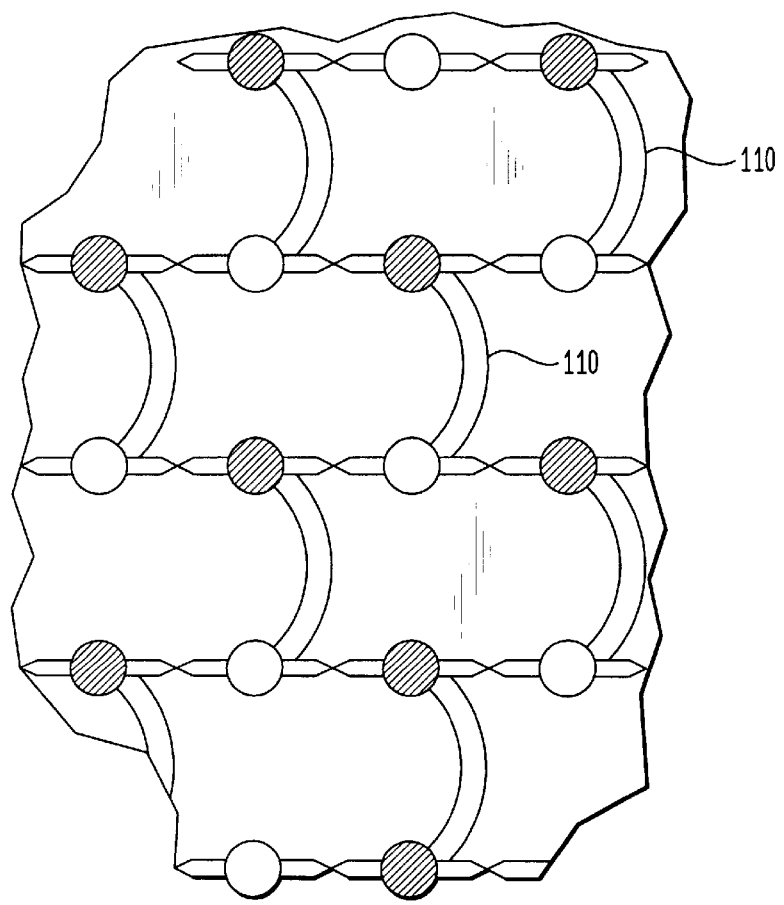
FIG. 8 is a fragmentary, diagrammatic top plan view depicting an element in accordance with a further embodiment of the invention.
Figure 9:
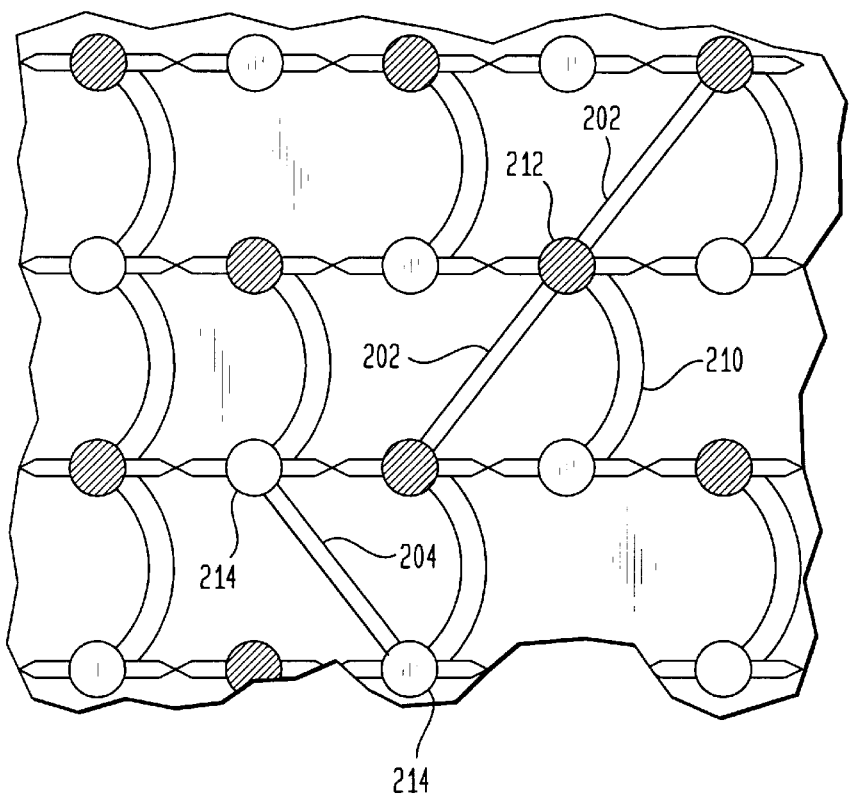
FIG. 9 is a view similar to FIG. 8 but depicting an element in accordance with yet another embodiment of the invention.
Figure 10:
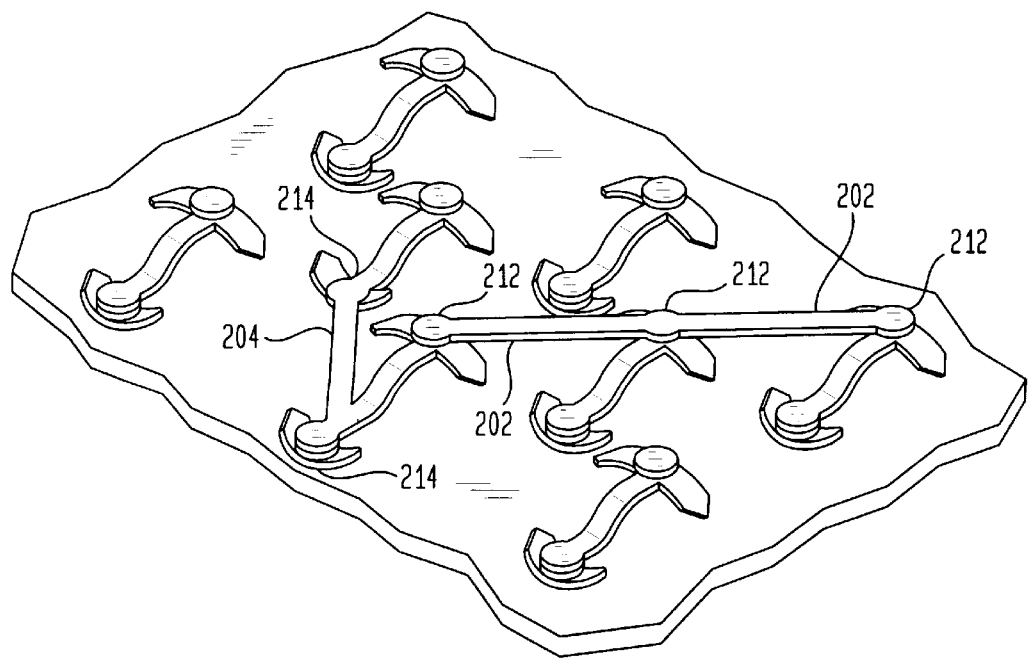
FIG. 10 is a fragmentary, diagrammatic perspective view depicting the element of FIG. 9 after further processing steps.

As shown in FIG. 7, the grid may include a first set of conductors 202 connected to the first ends 212 of one or more of the leads 210, and may also include a second set of conductors 204 connected to the second ends 214 of one or more of the leads. After the first and second ends of the leads are displaced vertically with respect to one another by moving the top and bottom elements as discussed above, the first set of conductors will extend at the top of the assembly, at the level of the first ends 212, as shown in FIG. 8, whereas the second set of conductors will extend at the bottom of the assembly, at the level of the second ends 214. The ability to provide such integral leads can be used, for example, to connect multiple contacts on a chip or other microelectronic element to one another in an assembly where tie microelectronic element is connected to another component through the leads 210. The particular patterns of first and second conductors shown in FIGS. 7 and 8 are merely illustrative; the conductors need not connect the ends of various leads together. For example, the conductors can extend from the ends of the leads to connections outside of the grid.

In the embodiments discussed above, the bonding material is provided on the grid. The particular placement of bonding material provides selective bonding action so that only the first end of each lead will bond with the top element whereas only the second end of each lead will bond to the bottom element. However, such selective bonding can be achieved without providing the bonding material on the grid. For example, where the grid is to be mated with elements having contacts or terminals at predefined locations, the bonding material may be carried by the contacts or terminals. Also, plate-like elements such as the plates 28 and 30 depicted in FIGS. 2 and 3 may be provided with spots of bonding material at the appropriate locations to provide the selective bonding action if the grid is aligned with these spots. In a further alternative, the bonding material used to hold the ends of the leads to the top element, the bottom element or both may be a temporary bonding material which is removed or degraded after the step of moving the top and bottom elements away from one another. Such a temporary bonding material may be either electrically conductive or dielectric. For example, a polymeric material degradable by exposure to ultraviolet or other radiation may be employed as a temporary bonding material. The top element, bottom element or both may be formed from materials transparent to such radiation as, for example, quartz or other glasses. After the moving the elements away from one another and deforming the leads, and desirably after injection of the liquid dielectric material around the leads, the top element, bottom element or both are removed by exposing the assembly to light so as to degrade the temporary bonding material.

Fabrication of the leads in the form of a continuous grid with the various leads connected to one another by frangible elements offers significant benefits. As mentioned above, the entire grid can be formed by subtractive etching from a metallic sheet, either before or after application of the bonding material and either before or after assembly of ancillary components such as dielectric supporting structures and application of bonding materials. The sheet, and the metallic grid tend to remain dimensionally stable so that each end of each lead remains at a predictable location relative to the other ends of the leads. This facilitates registration between the lead ends and contacts such as contacts on a wafer or other microelectronic component. Further, because the leads remain electrically connected to one another until the moving step breaks the frangible elements, the leads can be subjected to processes such as electroplating or electrochemical etching or polishing while the leads are present in the grid.

As these and other variations and combinations of the features discussed above can be utilized, the foregoing description should be taken as merely illustrative.

What is claimed is:

1. A method of making a microelectronic unit comprising:
   (a) providing a grid formed from a flexible, electrically conductive material, said grid having a bottom surface and a top surface, said grid including a plurality of elongated leads each having a first end and a second end, and frangible elements connecting the first ends of at least some of said leads to the second ends of others of said leads;
   (b) placing said grid between a top element and a bottom element so that said top surface of the grid faces toward the top element and the bottom surface of the grid faces toward the bottom element;
   (c) bonding said first ends of said leads to said top element but not said bottom element and the second ends of said leads to the bottom element but not the top element; and then
   (d) moving said top and bottom elements with a vertical component of motion away from one another so that the first ends of said leads move upwardly with respect to the second ends of said leads, whereby said frangible elements are broken and said leads are deformed to a vertically-extensive disposition.

2. A method as claimed in claim 1 wherein said grid has bonding material on the top surface but not on the bottom surface at the first ends of the lead, and wherein said grid has bonding material on the bottom surface but not on the top surface at the second ends of the leads, and wherein said bonding step includes the step of forming bonds using said bonding material.

3. A method as claimed in claim 2 wherein said top and bottom elements include metallic plates, the method further comprising the step of at least partially removing said metallic plates after said moving step.

4. A method as claimed in claim 3 wherein said step of at least partially removing said metallic plates is performed so as to leave portions of at least one of said metallic plates as conductive elements connected to said leads.

5. A method as claimed in any one of the preceding claims further comprising the step of injecting a flowable composition between said elements during or after said moving step and curing said flowable composition to form a dielectric layer surrounding said leads.

6. A method as claimed in claim 5 wherein said flowable composition is cured to form a compliant dielectric layer.

7. A method as claimed in claim 5 wherein said step of injecting said flowable material includes the step of injecting said flowable material under pressure so that the pressure of said flowable material assists in moving said top and bottom elements away from one another.

8. A method as claimed in claim 5 wherein, during said moving step, portions of said frangible elements which remain attached to said first ends of said leads are deformed downwardly relative to said first ends of said leads, said downwardly deformed portions of said frangible elements being embedded in said dielectric layer upon completion of said curing step, whereby said downwardly deformed portions of said frangible elements will aid in anchoring said first ends of said leads to said dielectric layer.

9. A method of as claimed in claim 5 wherein, during said moving step, portions of said frangible elements which remain attached to said second ends of said leads are deformed upwardly relative to said second ends, said upwardly deformed portions projecting into said dielectric layer upon completion of said curing step whereby said upwardly deformed portion will aid in anchoring the second ends of the leads to said dielectric layer.

10. A method as claimed in claim 1 wherein at least one of said elements includes a pre-formed microelectronic element having contacts thereon, said bonding step including the step of aligning either the first ends or the second ends of the leads with said contacts so that the first ends or the second ends of the leads are connected to said contacts.

11. A method as claimed in claim 1 wherein, prior to said moving step, said first and second ends of said leads are interspersed with one another so that in at least a portion of said grid, the first end of each said lead is disposed between the second ends of two other leads and connected thereto by frangible elements and the second end of each said lead is disposed between the first ends of two other leads and connected thereto by frangible elements.

12. A method as claimed in 1 wherein said grid includes one or more first conductors connected to the first ends of one or more of said leads, and wherein said first conductor remains connected to the first end of such lead after said moving step.

13. A method as claimed in 12 wherein said first conductors interconnect a plurality of said first ends of said leads.

14. A method is claimed in claim 12 wherein said grid also includes one or more second conductors connected to the second ends of one or more of said leads, said second conductors remaining attached to the second ends of said leads after said moving step.

* * * * *

UNITED STATES PATENT AND TRADEMARK OFFICE
CERTIFICATE OF CORRECTION

PATENT NO. : 6,063,648  
DATED : May 16, 2000  
INVENTOR(S) : Beroz et al.

Page 1 of 2

It is certified that error appears in the above-identified patent and that said Letters Patent is hereby corrected as shown below:

Title Page,
Item [54], "USINGS" should read -- USING --.

Column 1,
Line 1, "USINGS" should read -- USING --.
Line 67, after "such" insert -- as --.

Column 2,
Line 5, after "may" insert -- be --.
Line 23, "leads end" should read -- leads are --.

Column 3,
Line 2, "leads" should read -- leads' --.
Line 10, delete "a".
Line 18, "leads" should read -- lead --.
Line 27, after "dimensions" insert -- ; --.

Column 5,
Line 45, delete "is".

Column 6,
Line 40, after "such" insert -- as --.

Column 7,
Line 60, delete "the"

Column 9,
Line 12, delete "of".

UNITED STATES PATENT AND TRADEMARK OFFICE
CERTIFICATE OF CORRECTION

PATENT NO. : 6,063,648
DATED : May 16, 2000
INVENTOR(S) : Beroz et al.

It is certified that error appears in the above-identified patent and that said Letters Patent is hereby corrected as shown below:

Column 10,
Line 17, "is" should read -- as --.

Signed and Sealed this

Eleventh Day of September, 2001

*Attest:*

NICHOLAS P. GODICI
*Attesting Officer*    *Acting Director of the United States Patent and Trademark Office*